United States Patent
Song et al.

(10) Patent No.: US 9,502,442 B2
(45) Date of Patent: Nov. 22, 2016

(54) THIN FILM TRANSISTOR ARRAY SUBSTRATE AND METHOD OF MANUFACTURING THE SAME

(71) Applicant: SAMSUNG DISPLAY CO., LTD., Yongin, Gyeonggi-Do (KR)

(72) Inventors: Yong-Duck Song, Yongin (KR); Jong-Hyun Choi, Yongin (KR); Jun-Seon Seo, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/513,476

(22) Filed: Oct. 14, 2014

(65) Prior Publication Data

US 2015/0102344 A1    Apr. 16, 2015

(30) Foreign Application Priority Data

Oct. 14, 2013   (KR) .................. 10-2013-0122192

(51) Int. Cl.
| | |
|---|---|
| *H01L 27/12* | (2006.01) |
| *H01L 29/786* | (2006.01) |
| *H01L 29/49* | (2006.01) |
| *H01L 29/66* | (2006.01) |

(52) U.S. Cl.
CPC ....... *H01L 27/1255* (2013.01); *H01L 29/4908* (2013.01); *H01L 29/4958* (2013.01); *H01L 29/66757* (2013.01); *H01L 29/78666* (2013.01)

(58) Field of Classification Search
CPC ................... H01L 27/1255; H01L 29/78666; H01L 29/4958; H01L 29/66757; H01L 29/4908
See application file for complete search history.

(56) References Cited

U.S. PATENT DOCUMENTS

| | | | | |
|---|---|---|---|---|
| 2004/0263708 | A1* | 12/2004 | Cho | .................. G02F 1/136286 349/43 |
| 2004/0263746 | A1* | 12/2004 | Cho | .................... G02F 1/13439 349/139 |
| 2009/0302332 | A1 | 12/2009 | Kang et al. | |
| 2012/0168764 | A1 | 7/2012 | Kim | |
| 2012/0193624 | A1 | 8/2012 | You | |
| 2013/0015457 | A1 | 1/2013 | You | |

FOREIGN PATENT DOCUMENTS

| | | |
|---|---|---|
| KR | 10-2008-0094894 A | 10/2008 |
| KR | 10-2009-0127715 | 12/2009 |
| KR | 10-2012-0079727 | 7/2012 |
| KR | 10-2012-0089151 | 8/2012 |
| KR | 10-2013-0007902 | 1/2013 |

\* cited by examiner

*Primary Examiner* — Yasser A Abdelaziez
(74) *Attorney, Agent, or Firm* — Lee & Morse P.C.

(57) ABSTRACT

A thin film transistor array substrate and a method of manufacturing the thin film transistor array substrate are provided. The thin film transistor array substrate may include: a substrate; a thin film transistor (TFT) including an active layer, a gate electrode, a source electrode, and a drain electrode on the substrate. The gate electrode may include a bottom gate electrode and a top gate electrode that covers upper and lateral surfaces of the bottom gate electrode.

18 Claims, 7 Drawing Sheets

THIN FILM TRANSISTOR ARRAY SUBSTRATE AND METHOD OF MANUFACTURING THE SAME

CROSS-REFERENCE TO RELATED APPLICATION

Korean Patent Application No. 10-2013-0122192, filed on Oct. 14, 2013, in the Korean Intellectual Property Office, and entitled: "Thin Film Transistor Array Substrate And Method Of Manufacturing The Same," is incorporated by reference herein in its entirety.

BACKGROUND

1. Field

Embodiments relate to a thin film transistor array substrate and a method of manufacturing the same.

2. Description of the Related Art

A flat panel display device such as an organic light emitting display device or a liquid crystal display device may include a thin film transistor (TFT), a capacitor, and wiring connecting these elements.

A substrate on which a flat panel display device is manufactured may include TFTs, capacitors, and wirings in minute patterns, and the minute patterns of the substrate may be formed using a photolithography method in which patterns are transferred using a mask.

According to the photolithography method, a substrate on which patterns are to be formed may be coated uniformly with a photoresist, and the photoresist may be exposed using an exposure device such as a stepper, and then the photosensitized photoresist may be developed. After developing the photoresist, patterns on the substrate may be etched using the remaining photoresist, and then unnecessary portions of the photoresist may be removed after forming the patterns.

SUMMARY

One or more embodiments include a thin film transistor array substrate and a method of manufacturing the same.

According to one or more embodiments, a thin film transistor array substrate may include: a substrate; and a thin film transistor (TFT) including an active layer, a gate electrode, a source electrode, and a drain electrode on the substrate. The gate electrode may includes a bottom gate electrode and a top gate electrode that covers upper and lateral surfaces of the bottom gate electrode.

The thin film transistor array substrate may further include a capacitor that may include a bottom electrode formed in the same layer as the active layer and a top electrode formed of the same material as the top gate electrode. The bottom electrode and the top electrode may be separated via a gate insulating layer.

The bottom electrode may include a semiconductor material doped with ion impurities.

A thickness of the top electrode may be in a range from about 50 nm to about 200 nm.

The thin film transistor array substrate may further include a capacitor including a bottom electrode formed of the same material as the top gate electrode and a top electrode formed of the same material as the source electrode. The bottom electrode and the top electrode may be separated via an interlayer insulating layer.

The bottom gate electrode may have a multi-layer structure in which heterogeneous metals are stacked.

The thin film transistor array substrate may further include a pad electrode that is formed in the same layer as the gate electrode and which may include a bottom pad electrode and a top pad electrode that covers upper and lateral surfaces of the bottom pad electrode.

The pad electrode may be electrically connected to the TFT to apply a current to the TFT.

The top gate electrode may include at least one of Mo, Ti, a Mo/Ti structure, and a Mo/Al/Ti structure.

The top gate electrode may have a thickness ranging from about 50 nm to about 200 nm.

According to one or more embodiments, a method of manufacturing a thin film transistor array substrate, may include: forming an active layer pattern of a thin film transistor (TFT) and a bottom electrode pattern of a capacitor; forming a gate insulating layer that covers the active layer pattern and the bottom electrode pattern; forming a bottom gate electrode on the gate insulating layer such that at least a portion of the bottom gate electrode is overlapped with the active layer pattern; and forming a top gate electrode on the bottom gate electrode and a top electrode on the gate insulating layer at the same time such that the top electrode is overlapped with the bottom electrode pattern.

The method may further include, after the forming of a top gate electrode and a top electrode, forming an active layer including a source region and a drain region and a bottom electrode by doping two sides of the active layer pattern and the bottom electrode pattern with ion impurities.

The method may further include, between the forming of a bottom gate electrode and the forming of a top gate electrode and a top electrode, forming an active layer including a source region and a drain region and a bottom electrode by doping two sides of the active layer pattern and the bottom electrode pattern with ion impurities.

The method may further include forming an interlayer insulating layer that covers the top gate electrode and the top electrode; and forming a first contact hole, a second contact hole, and a third contact hole that expose the source region, the drain region, and the top electrode, respectively, by etching the interlayer insulating layer.

The forming of first, second, and third contact holes may include a wet etching operation, and a buffered oxide etchant (BOE) may be used in the wet etching method.

The top gate electrode and the top electrode may include at least one of Mo, Ti, a Mo/Ti structure, and a Mo/Al/Ti structure.

The top gate electrode and the top electrode may each have a thickness ranging from about 50 nm to about 200 nm.

The active layer pattern and the bottom electrode pattern may be formed of a semiconductor material.

The top gate electrode may cover upper and lateral surfaces of the bottom gate electrode.

The bottom gate electrode may be formed of a bi-layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
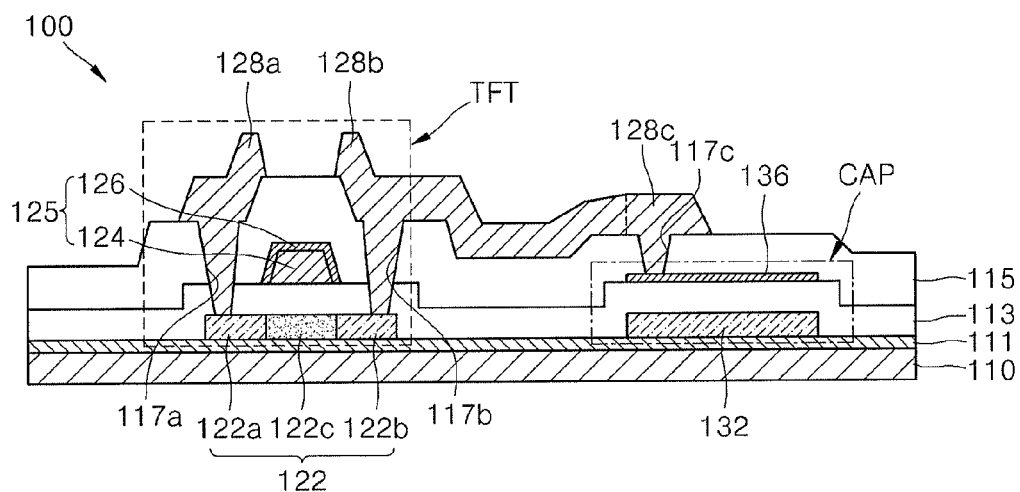
FIG. 1 illustrates a schematic cross-sectional view illustrating a thin film transistor array substrate according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will also be understood that when a layer is referred to as being "between" two layers, it can be the only layer between the two layers, or one or more intervening layers may also be present. Like reference numerals refer to like elements throughout.

It will be understood that when a layer, region, or component is referred to as being "on" or "formed on," another layer, region, or component, it can be directly or indirectly on or formed on the other layer, region, or component. That is, for example, intervening layers, regions, or components may be present.

It will be understood that although the terms "first", "second", etc. may be used herein to describe various components, these components should not be limited by these terms. These components are only used to distinguish one component from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

FIG. 1 illustrates a schematic cross-sectional view illustrating a thin film transistor array substrate 100 according to an embodiment.

Referring to FIG. 1, the thin film transistor array substrate 100 includes a substrate 100 and thin film transistor (TFT) including an active layer 122, a gate electrode 120, a source electrode 128a, and a drain electrode 128b formed on the substrate 110. The gate electrode 120 includes a bottom gate electrode 124 and a top gate electrode 126 that covers upper and lateral surfaces of the bottom gate electrode 124.

Also, the thin film transistor array substrate 100 may further include a capacitor CAP including a bottom electrode 132 that is formed in the same layer as the active layer 122 and a top electrode 136 formed of the same material as the top gate electrode 126.

In addition, the thin film transistor array substrate 100 may further include a buffer layer 111, a gate insulating layer 113, and an interlayer insulating layer 115. The bottom electrode 132 and the top electrode 136 of the capacitor CAP may be separated from each other via a gate insulating layer 113. The active layer 122 and the gate electrode 120 may be separated from each other via an interlayer insulating layer 115.

The substrate 110 may be formed of a glass, a plastic, or a metal. The substrate 110 may be a flexible substrate.

The buffer layer 111 may be formed on the substrate 110. The buffer layer 111 may provide a planar surface on the substrate 100, and may include an insulating material so as to prevent penetration of water or foreign substance into the substrate 110 from the outside. The buffer layer 111 may be omitted in some embodiments.

A TFT is formed on the substrate 110. The TFT includes an active layer 122, a gate electrode 120, a source electrode 128a, and a drain electrode 128b.

The active layer 122 may be formed of a semiconductor including amorphous silicon or crystalline silicon, and may include a channel region 122c, a source region 122a, and a drain region 122b that are formed on two sides of the channel region 122c and may be doped with ion impurities. According to embodiments, the source region 122a and the drain region 122b may be formed of a p-type semiconductor by doping with a Group III element. According to embodiments, the source region 122a and the drain region 122b may be formed of an n-type semiconductor by doping with a Group V element.

The gate electrode 125 may be disposed above the active layer 122 at a corresponding position to the channel region 122c of the active layer 122 while the gate insulating layer 113 may be disposed between the active layer 122 and the gate electrode 125.

The gate insulating layer 113 may be formed of an insulating material and may electrically separate the active layer 122 and the gate electrode 125. According to embodiments, the gate insulating layer 113 may an inorganic material or an organic material in a single-layer structure or a stack structure including these materials.

The gate electrode 120 may be formed of a bottom gate electrode 124 and a top gate electrode 126. The top gate electrode 126 may function as a barrier layer that may prevent diffusion of oxygen or the like into the bottom gate electrode 124 and/or may prevent deformation of the bottom gate electrode 124 at a relatively high process temperature.

The top gate electrode 126 may cover not only an upper portion but also a lateral surface of the bottom gate electrode 124, and thus may prevent penetration of an element that may react with the bottom gate electrode 124, into the lateral surface of the bottom gate electrode 124.

According to embodiments, a coefficient of thermal expansion of the top gate electrode 126 may be smaller than that of the bottom gate electrode 124. Accordingly, deformation of the bottom gate electrode 124 which may occur at a relatively high process temperature may be reduced or prevented.

According to embodiments, the top gate electrode 126 may include at least one of molybdenum (Mo) and titanium (Ti). According to embodiments, the top gate electrode 126 may include a Mo/Ti structure which may be a stack structure including Mo and Ti. According to embodiments, the top gate electrode 126 may also include another metal between Mo and Ti. For example, the top gate electrode 126 may have a Mo/aluminum (Al)/Ti structure.

According to embodiments, the top gate electrode 126 may have a thickness ranging from about 50 nm to about 200 nm.

The bottom gate electrode 124 may be a main electrode that applies a gate voltage to the TFT, and includes a conductive material. According to embodiments, a thickness of the bottom gate electrode 124 may be thicker than a thickness of the top gate electrode 126. According to embodiments, the bottom gate electrode 124 may include a material having a higher conductivity than the top gate electrode 126.

The bottom gate electrode 124 may be formed of a single layer or multiple layers. According to embodiments, the bottom gate electrode 124 may be formed of a single layer or multiple layers formed of aluminum (Al), an Al alloy, copper (Cu), silver (Ag), nickel (Ni), chromium (Cr), Mo, Ti, platinum (Pt), tantalum (Ta), or a combination thereof.

The interlayer insulating layer 115 including a first contact hole 117a, a second contact hole 117b, and a third contact hole 117b may be formed on the gate electrode 120. The interlayer insulating layer 115 may electrically separate the gate electrode 125 from each of the source electrode 128a and the drain electrode 128b.

The interlayer insulating layer 115 may be formed of various insulating materials. For example, the interlayer insulating layer 115 may be formed of an inorganic material such as an oxide or a nitride, or also of an organic material. According to embodiments, the interlayer insulating layer 115 may be formed of an inorganic material or an organic material in a single-layer structure or a stack structure including these materials.

The first contact hole 117a and the second contact hole 117b of the interlayer insulating layer 115 may be formed to pass through the gate insulating layer 113 and to extend to the source region 122a and the drain region 122b of the active layer 122. Accordingly, the source electrode 128a and the drain electrode 128b may respectively contact the source region 122a and the drain region 122b of the active layer 122 through the first contact hole 117a and the second contact hole 117b. The source region 122a and the drain region 122b may be formed of a single layer or multiple layers.

The thin film transistor array substrate 100 may further include the capacitor CAP including the bottom electrode 132 formed in the same layer as the active layer 122 and the top electrode 136 that is formed of the same material as the top gate electrode 126.

The bottom electrode 132 may include a semiconductor material doped with impurities. The bottom electrode 132 may be formed of a semiconductor including amorphous silicon or crystalline silicon, and may be doped with ion impurities. According to embodiments, the bottom electrode 132 may be formed of a p-type semiconductor by doping with a Group III element. According to embodiments, the bottom electrode 132 may be formed of an n-type semiconductor by doping with a Group V element. According to embodiments, the bottom electrode 132 may be formed of the same material as the source region 122a and the drain region 122b.

When the bottom electrode 132 is formed of an intrinsic semiconductor that is not doped with ion impurities, the capacitor CAP forms a metal oxide semiconductor (MOS) CAP structure with the top electrode 136. However, when the bottom electrode 132 is formed of a semiconductor doped with ion impurities as in the current embodiment, the capacitor CAP forms a metal-insulator-metal (MIM) CAP structure with the top electrode 136. A MIM CAP structure may maintain constant electrostatic capacity in a relatively wide voltage range compared to a MOS CAP structure. Accordingly, when designing a circuit, a voltage design margin may be increased.

The top electrode 136 may be formed of a material that is not etched by an etchant used in forming the first contact hole 117a, the second contact hole 117b, and the third contact hole 117c of the interlayer insulating layer 115. Accordingly, when forming the third contact hole 117c, an additional electrode layer to protect the top electrode 136 may not be included, thereby simplifying the structure of the thin film transistor array substrate.

According to embodiments, the top electrode 136 may include at least one of Mo and Ti. According to embodiments, the top gate electrode 126 may include a Mo/Ti structure which is a stack structure including Mo and Ti. According to embodiments, the top gate electrode 126 may also include another metal between Mo and Ti. For example, the top gate electrode 126 may have a Mo/Al/Ti structure.

According to embodiments, the top electrode 136 may be formed of the same material as the top gate electrode 126.

According to embodiments, the top electrode 136 may have a thickness of about 50 nm to about 200 nm. A doping process of the bottom electrode 134 may be performed after the top electrode 136 is formed.

The top electrode 136 may contact a contact electrode 128c via the third contact hole 117c of the interlayer insulating layer 115. The contact electrode 128c may be connected to the source electrode 128a or the drain electrode 128b of the TFT. Positions of the source electrode 128a and the drain electrode 128b are not limited to those illustrated in FIG. 1.

The bottom electrode 132 and the top electrode 136 may be electrically separated via the gate insulating layer 113.

Figure 2:
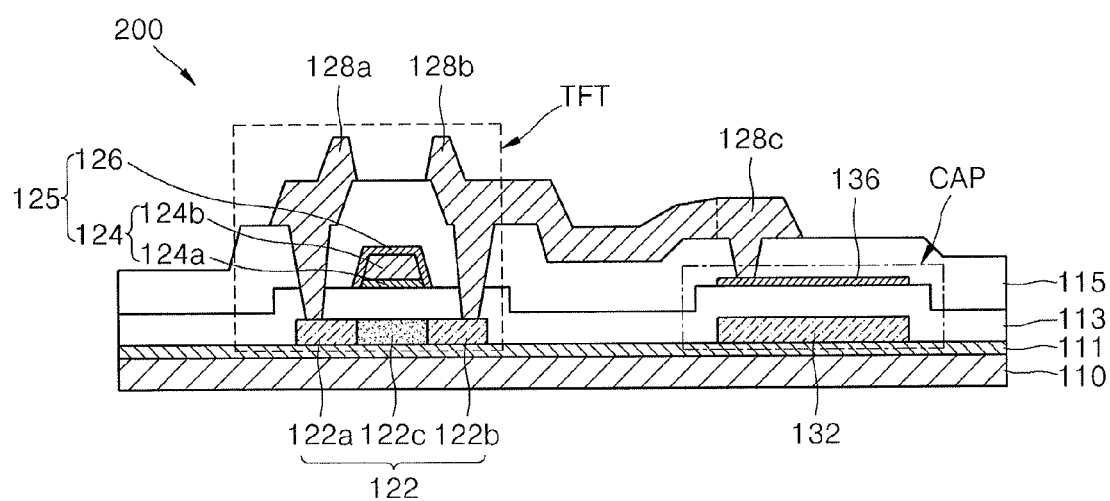
FIG. 2 illustrates a schematic cross-sectional view illustrating a thin film transistor array substrate according to another embodiment.

FIG. 2 illustrates a schematic cross-sectional view illustrating a thin film transistor array substrate 200 according to another embodiment. Referring to FIG. 2, like reference numerals as those in FIG. 1 denote like members, and description thereof will be omitted for simplification of description.

The thin film transistor array substrate 200 of FIG. 2 is different from the thin film transistor array substrate 100 of FIG. 1 in that the bottom gate electrode 124 of the gate electrode 125 is formed of multiple layers.

The bottom gate electrode 124 may include a first bottom gate electrode 124a and a second bottom gate electrode 124b. The first bottom gate electrode 124a may prevent diffusion of oxygen or the like into the second bottom gate electrode 124b from the gate insulating layer 113 and/or may improve an adhesive force of the gate insulating layer 113 and the gate electrode 125.

The first bottom gate electrode 124a may include at least one of Mo and Ti. According to embodiments, the first bottom gate electrode 124a may have a Mo/Ti structure which is a stack structure including Mo and Ti. According to embodiments, the first bottom gate electrode 124a may be formed of the material as the top gate electrode 126.

The second bottom gate electrode 124b may be formed of a single layer or multiple layers. The second bottom gate electrode 124b may be formed of Al, an Al alloy, Cu, Ag, Ni, Cr, Mo, Ti, Pt, Ta, or a combination thereof in a single-layer structure or a multi-layer structure.

Figure 3:
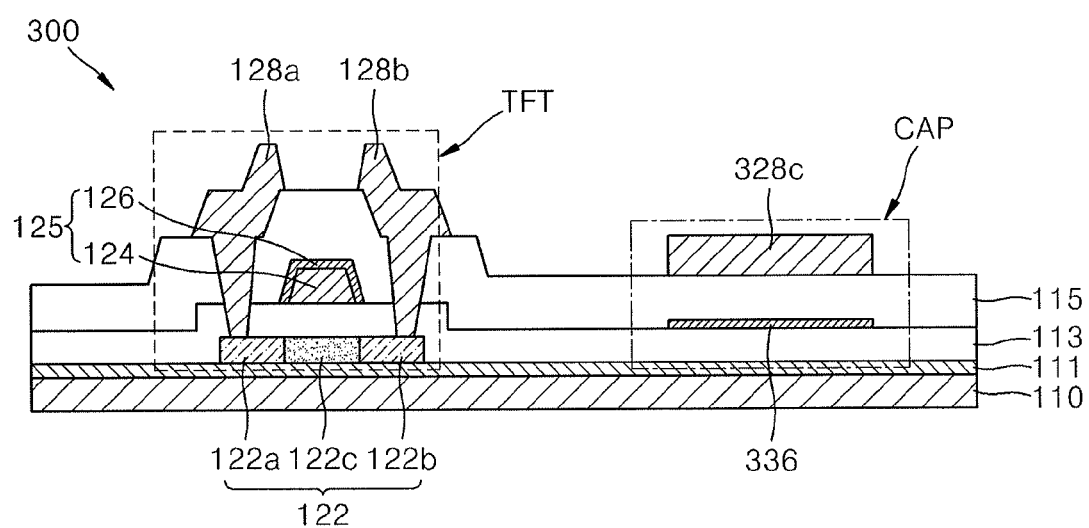
FIG. 3 illustrates a schematic cross-sectional view illustrating a thin film transistor array substrate according to another embodiment.

FIG. 3 illustrates a schematic cross-sectional view illustrating a thin film transistor array substrate 300 according to another embodiment. Referring to FIG. 3, like reference numerals as those in FIG. 1 denote like members, and description thereof will be omitted for simplification of description.

The thin film transistor array substrate 300 of FIG. 3 is different from the thin film transistor array substrate 100 of FIG. 1 in that a bottom electrode 336 of a capacitor CAP is formed of the same material as the top gate electrode 126 of a TFT, and a top electrode 328c is formed of the same material as the source electrode 128c and the drain electrode 128b of the TFT.

The bottom electrode 336 may be formed of the same material as the top gate electrode 126. According to embodiments, the bottom electrode 336 may include at least one of Mo and Ti. According to embodiments, the bottom electrode 336 may include a Mo/Ti structure which is a stack structure including Mo and Ti. According to embodiments, the bottom electrode 336 may also include another metal between Mo and Ti. For example, the bottom electrode 336 may have a Mo/Al/Ti structure.

The top electrode 328c may be formed of the same material as the source electrode 128c and the drain electrode 128b. The top electrode 328c may be formed of a conductive material in a single-layer structure or a multi-layer structure.

The bottom electrode 326 and the top electrode 328c may be separated via the interlayer insulating layer 115.

Figure 4:
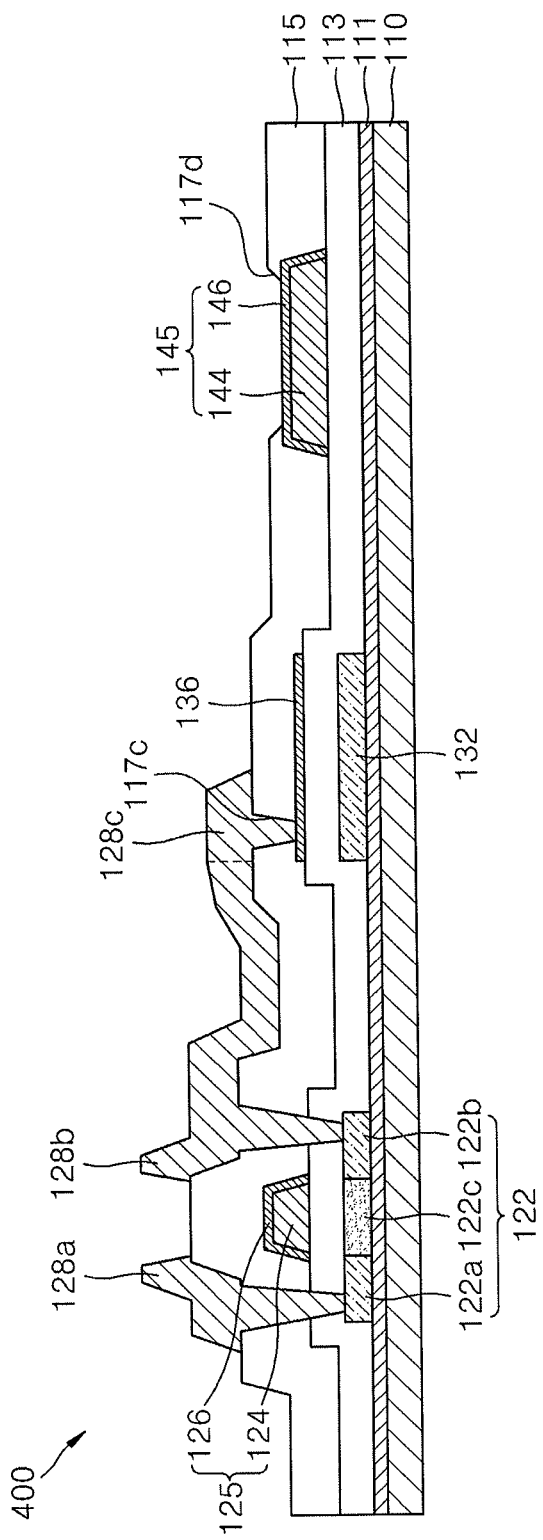
FIG. 4 illustrates a schematic cross-sectional view illustrating a thin film transistor array substrate according to another embodiment.

FIG. 4 illustrates a schematic cross-sectional view illustrating a thin film transistor array substrate 400 according to another embodiment. Referring to FIG. 4, like reference numerals as those in FIG. 1 denote like members, and description thereof will be omitted for simplification of description.

The thin film transistor array substrate 400 of FIG. 4 is different from the thin film transistor array substrate 100 of FIG. 1 in that the thin film transistor array substrate 400 further includes a pad electrode 145.

The pad electrode 145 may be electrically connected to a driver IC (not shown) that applies a current to drive a TFT. Accordingly, the pad electrode 145 may receive a current from the driver IC to transfer the current to the TFT. The pad electrode 145 may be electrically connected to the TFT.

The pad electrode 145 may be formed in the same layer as the gate electrode 125. The pad electrode 145 may include a bottom pad electrode 144 and a top pad electrode 145 that covers upper and lateral surface of the bottom pad electrode 144.

According to embodiments, the pad electrode 145 may be formed of the same material as the gate electrode 125. The bottom pad electrode 144 may be formed of the same material as the bottom gate electrode 124 using the same operation. The top pad electrode 146 may be formed of the same material as the top gate electrode 126 using the same operation.

The top pad electrode 145 covers the upper and lateral surfaces of the bottom pad electrode 144, and thus may prevent an element from diffusing into and reacting with the bottom pad electrode 144. Also, the top pad electrode 145 may prevent deformation of the bottom pad electrode 144 during a process.

The interlayer insulating layer 115 may have a fourth contact hole 117d to expose the pad electrode 145.

FIGS. 5A through 5E illustrate cross-sectional views illustrating a method of manufacturing the thin film transistor array substrate 100, 200, 300, or 400 in an order, according to an embodiment. According to the current embodiment, the method of manufacturing the thin film transistor array substrate 100 of FIG. 1 will be described.

Figure 5A:
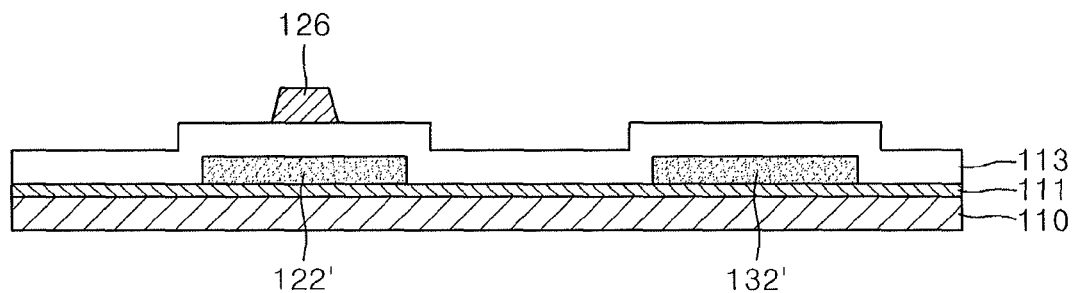
FIGS. 5A through 5E illustrate cross-sectional views illustrating a method of manufacturing a thin film transistor array substrate in an order, according to an embodiment.

Referring to FIG. 5A, a first mask operation of forming an active layer pattern 122' and a bottom electrode pattern 132' on a substrate 110 and a second mask operation of forming the bottom gate electrode 124 are performed.

First, the buffer layer 111 may be deposited on the entire surface of the substrate 110. The buffer layer 111 may be formed of an insulating material and may be deposited using various deposition methods. The buffer layer 111 may be omitted in some embodiments.

Next, while not shown in FIG. 5A, a semiconductor layer (not shown) may be deposited on the entire surface of the substrate 110, and the semiconductor layer (not shown) may be patterned using a photolithography method using a first mask, thereby forming the active layer pattern 122' and the bottom electrode pattern 132'.

The photolithography method may be performed by sequentially performing coating a photoresist, selectively exposing the photoresist using a first mask, developing, etching, and stripping or ashing. The etching may be performed by wet etching, dry etching, or a combination of these methods.

A semiconductor layer (not shown) may be formed of amorphous silicon or crystalline silicon. The crystalline silicon may be formed by crystallizing amorphous silicon. Amorphous silicon may be crystallized using various methods such as a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method.

Next, the gate insulating layer 113 covering the active layer pattern 122' and the bottom electrode pattern 132' may be formed.

The gate insulating layer 113 may be formed of an organic insulating material or an inorganic insulating material in a single-layer structure or a stack structure including these materials. According to embodiments, the gate insulating layer 113 may be formed of, for example, a silicon nitride layer (SiNx), a silicon oxide layer (SiO2), a hafnium (Hf) oxide, or an aluminum oxide. The gate insulating layer 113 may be formed using various deposition methods such as a chemical vapor deposition (CVD) method or a plasma enhanced CVD (PECVD) method.

Next, a first conductive layer (not shown) may be formed on the entire surface of the gate insulating layer 113 to form the bottom gate electrode 124, and then a photolithography method using a second mask may be performed. Accordingly, the first conductive layer may be patterned, thereby forming the bottom gate electrode 124.

The bottom gate electrode 124 may be formed of a conductive material in a single-layer structure or a multi-layer structure. According to embodiments, the bottom gate electrode 124 may be formed of Al, Al alloy, Cu, Ag, Ni, Cr, Mo, Ti, Pt, Ta, or a combination thereof, in a single-layer structure or a multi-layer structure, and by using various deposition methods.

Figure 5B:
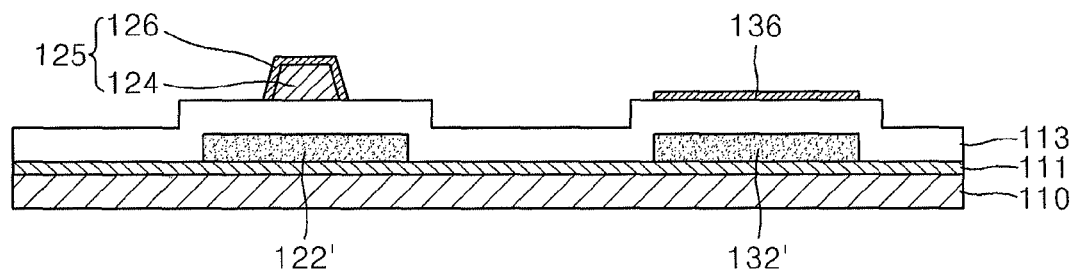

Referring to FIG. 5B, a third mask operation of forming the top gate electrode 126 and the top electrode 136 may be performed.

First, a top conductive layer (not shown) may be formed on the entire surface of the substrate 110 to cover the bottom gate electrode 124.

Next, a photolithography method using a third mask may be performed. Accordingly, a second conductive layer (not shown) may be patterned, thereby forming the top gate electrode 126 and the top electrode 136 at the same time.

The top gate electrode 126 and the top electrode 136 may have a thickness of about 50 nm to about 200 nm.

The top gate electrode 126 and the top electrode 136 may be formed of a material that is not etched by an etchant which is used in forming the first contact hole 117a, the second contact hole 117b, and the third contact hole 117c (referring to FIG. 5E) of the interlayer insulating layer 115. Accordingly, when forming the third contact hole 117c, an additional electrode layer to protect the top electrode 136 may not be necessary, and thus, a structure of the thin film transistor array substrate 100 may be simplified.

The top gate electrode 126 and the top electrode 136 may include at least one of Mo and Ti. According to embodiments, the top gate electrode 126 may include a Mo/Ti structure which is a stack structure including Mo and Ti. According to embodiments, the top gate electrode 126 may also include another metal between Mo and Ti. For example, the top gate electrode 126 may have a Mo/Al/Ti structure.

The top gate electrode 126 and the top electrode 136 may be formed using various deposition methods.

Figure 5C:
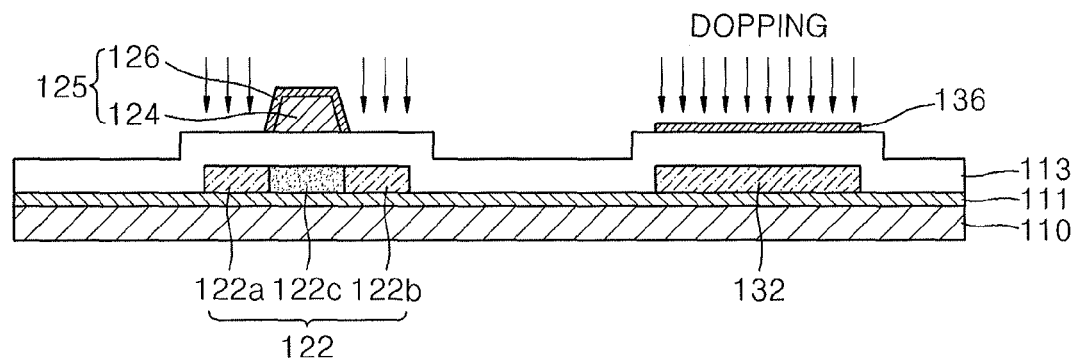

Referring to FIG. 5C, after the gate electrode 125 and the top electrode 136 are formed, two ends of the active layer pattern 122' (see FIG. 5B) and the bottom electrode pattern 132' (see FIG. 5B) may be doped with ion impurities.

The ion impurities may be Group III or Group V elements as described above, and may be doped at a density of $1 \times 10^{15}$ atoms/cm² or higher.

The active layer pattern 122' (see FIG. 5B) may be doped with ion impurities by using the gate electrode 125 as a self-aligned mask, thereby forming an active layer 122. The active layer 122 includes the source region 122a and the drain region 122b doped with ion impurities, and the channel region 122c between the source and drain regions 122a and 122b. That is, the source region 122a and the drain region 122b may be formed by using the gate electrode 125 as a self-align mask (i.e. without adding a mask).

Also, as the top electrode 136 of the capacitor may be relatively thin (about 200 nm or less), the ion impurities may pass through the top electrode 136. Accordingly, the bottom electrode pattern 132' may be doped with the ion impurities, thereby forming the bottom electrode 132. As a result, the bottom electrode 132 doped with the ion impurities may form a MIM CAP structure with the capacitor top electrode 136, and accordingly, a voltage design margin may be increased in a circuit design. Also, by doping the active layer 122 and the bottom electrode 132 at the same time by one-time doping, the manufacturing costs due to a doping process may be reduced.

Figure 5D:
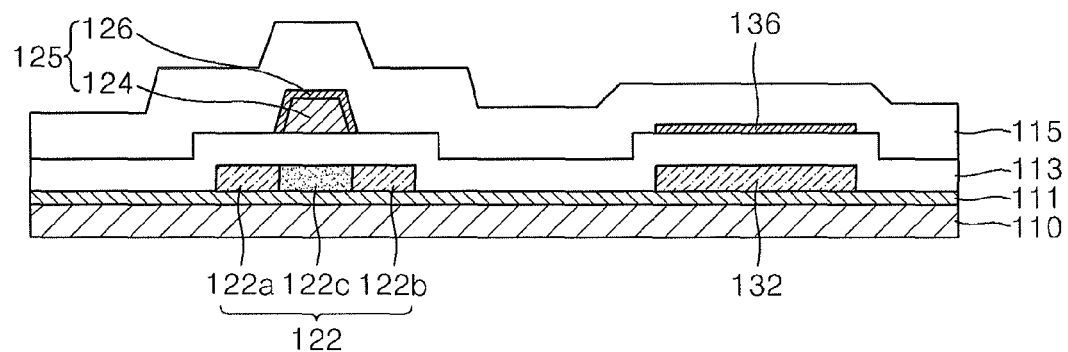

Referring to FIG. 5D, the interlayer insulating layer 115 may be formed to cover the gate electrode 125 and the top electrode 136.

The interlayer insulating layer 115 may be formed of various insulating materials. For example, the interlayer insulating layer 115 may be formed of an inorganic material such as an oxide or a nitride, or an organic material. According to embodiments, the interlayer insulating layer 115 may be formed of an inorganic material or an organic material in a single-layer structure or a stack structure including these materials.

The interlayer insulating layer 115 may be formed using various deposition methods such as a CVD method or a PECVD method.

Figure 5E:
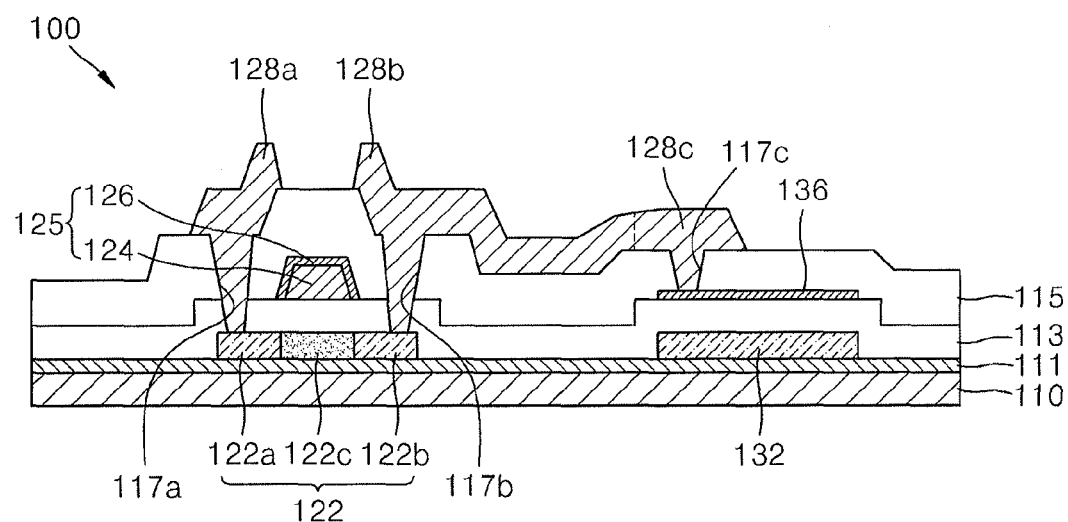

Referring to FIG. 5E, the source electrode 128a, the drain electrode 128b, and the contact electrode 128c may be formed.

First, by performing a photolithography method using a fourth mask on the interlayer insulating layer 115, the interlayer insulating layer 115 may be selectively etched to form the first contact hole 117a, the second contact hole 117b, and the third contact hole 117c through which portions of the source region 122a, the drain region 122b, and the top electrode 136 are exposed.

An etching operation may be performed by wet etching, dry etching, or a combination thereof. According to embodiments, the etching operation may be a wet etching operation in which a buffered oxide etchant (BOE) is used.

Next, the source electrode 128a, the drain electrode 128b, and the contact electrode 128c may be formed using a fifth mask. The source electrode 128a, the drain electrode 128b, and the contact electrode 128c may be formed of a conductive material in a single-layer structure or a multi-layer structure.

FIGS. 6A through 6E illustrate cross-sectional views illustrating a method of manufacturing the thin film transistor array substrate 100, 200, 300, or 400 in an order, according to an embodiment. According to the current embodiment, the method of manufacturing the thin film transistor array substrate 200 illustrated in FIG. 2 is described. Like reference numerals as those in FIGS. 5A through 5E denote like members, and description thereof will be omitted for simplification of description.

Compared to the method of FIGS. 5A through 5E, the method of FIGS. 6A through 6E are different in that the bottom gate electrode 124 is formed of a bi-layer and that the active layer pattern 122' and the bottom electrode pattern 132' are doped with ion impurities before forming the top gate electrode 126 and the top electrode 136.

Figure 6A:
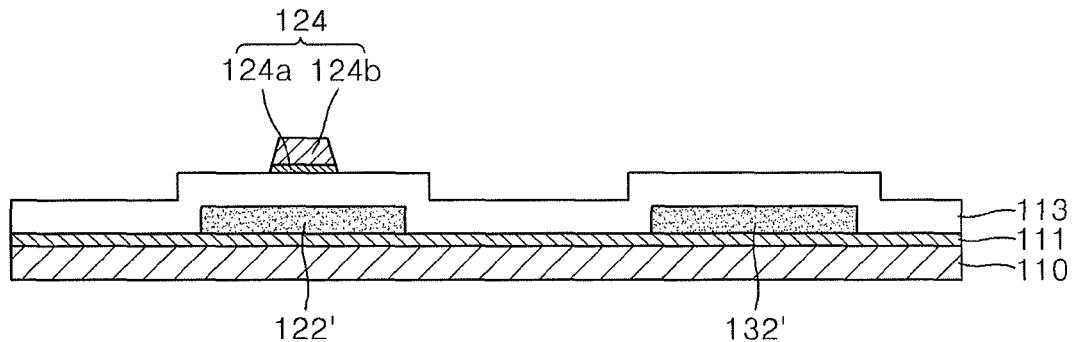
FIGS. 6A through 6E illustrate cross-sectional views illustrating a method of manufacturing a thin film transistor array substrate in an order, according to an embodiment.
Figure 6B:
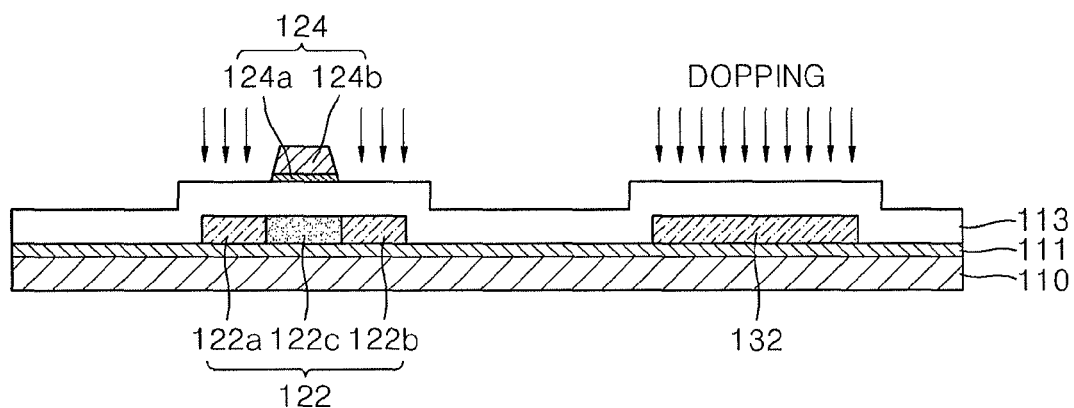
Figure 6C:
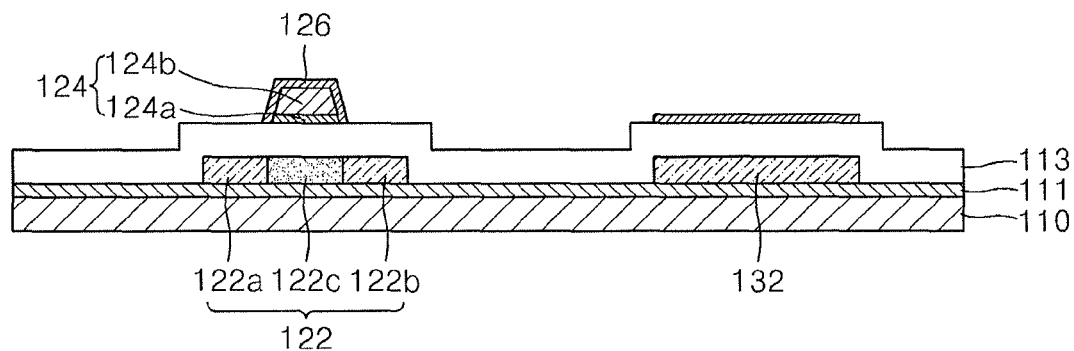
Figure 6D:
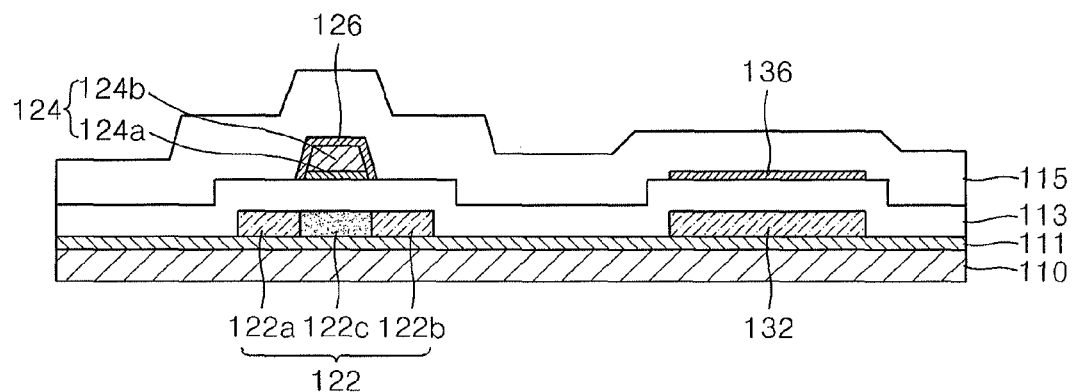
Figure 6E:
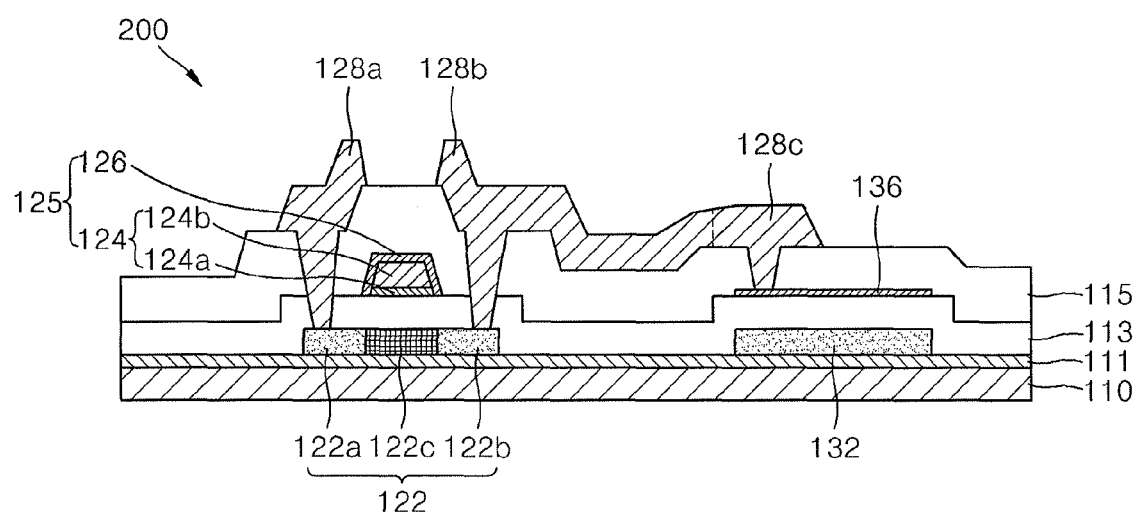

Referring to FIG. 6A, the bottom gate electrode 124 may be formed by depositing a bi-layer as a first conductive layer (not shown) on the entire surface of the gate insulating layer 113, and patterning the first bottom gate electrode 124a and the second bottom gate electrode 124b at the same time by using a second mask operation.

According to the method of manufacturing illustrated in FIGS. 6A through 6E, as an ion impurity doping operation is first performed, and then the top gate electrode 126 and the top electrode 136 are formed, various modifications such as the top gate electrode 126 and the top electrode 136 each having a thickness of about 200 nm or greater may be enabled.

The thin film transistor array substrate 100, 200, 300, or 400 according to the embodiments may be used in various display devices. For example, the thin film transistor array substrate 100, 200, 300, or 400 may be used in an organic light emitting display device or a liquid crystal display device. However, the application is not limited thereto, and may also be used in other various display devices such as a plasma display device or an electrophoretic display device.

By way of summation and review, according to the one or more of the above embodiments, electrical characteristics of the thin film transistor array substrate according to the embodiments may be improved. In addition, according to the methods of manufacturing a thin film transistor array substrate of the embodiments, processes may be simplified, thereby reducing the manufacturing costs and time.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor array substrate, comprising:
a substrate; and
a thin film transistor (TFT) comprising an active layer, a gate electrode, a source electrode, and a drain electrode on the substrate,
wherein the gate electrode includes a bottom gate electrode and a top gate electrode that covers only upper and lateral surfaces of the bottom gate electrode, the top gate electrode covering entireties of lateral surfaces of the bottom gate electrode and contacting a non conductive layer directly under the bottom gate electrode.

2. A thin film transistor array substrate, comprising:
a substrate;
a thin film transistor (TFT) comprising an active layer, a gate electrode, a source electrode, and a drain electrode on the substrate, the gate electrode including a bottom gate electrode and a top gate electrode that covers upper and lateral surfaces of the bottom gate electrode, and
a capacitor that includes a bottom electrode formed in a same layer as the active layer and a top electrode formed of a same material as the top gate electrode,
wherein the bottom electrode and the top electrode are separated via a gate insulating layer.

3. The thin film transistor array substrate as claimed in claim 2, wherein the bottom electrode includes a semiconductor material doped with ion impurities.

4. The thin film transistor array substrate as claimed in claim 2, wherein a thickness of the top electrode ranges from about 50 nm to about 200 nm.

5. The thin film transistor array substrate as claimed in claim 1, further comprising a capacitor including a bottom electrode formed of a same material as the top gate electrode and a top electrode formed of a same material as the source electrode, wherein the bottom electrode and the top electrode are separated via an interlayer insulating layer.

6. The thin film transistor array substrate as claimed in claim 1, wherein the bottom gate electrode has a multi-layer structure wherein heterogeneous metals are stacked.

7. The thin film transistor array substrate as claimed in claim 1, further comprising a pad electrode that is formed in a same layer as the gate electrode and includes a bottom pad electrode and a top pad electrode that covers upper and lateral surfaces of the bottom pad electrode.

8. The thin film transistor array substrate as claimed in claim 7, wherein the pad electrode is electrically connected to the TFT to apply a current to the TFT.

9. The thin film transistor array substrate as claimed in claim 1, wherein the top gate electrode includes at least one of Ti, a Mo/Ti structure, and a Mo/Al/Ti structure.

10. The thin film transistor array substrate as claimed in claim 1, wherein the top gate electrode has a thickness ranging from about 50 nm to about 200 nm.

11. A method of manufacturing a thin film transistor array substrate, the method comprising:
forming an active layer pattern of a thin film transistor (TFT) and a bottom electrode pattern of a capacitor;
forming a gate insulating layer that covers the active layer pattern and the bottom electrode pattern;
forming a bottom gate electrode on the gate insulating layer, wherein at least a portion of the bottom gate electrode is overlapped with the active layer pattern; and
forming a top gate electrode on only upper and lateral surfaces of the bottom gate electrode and a top electrode on the gate insulating layer at the same time, wherein the top electrode is overlapped with the bottom electrode pattern, and the top gate electrode covers entireties of lateral surfaces of the bottom gate electrode, such that the top gate electrode contacts a non conductive layer directly under the bottom gate electrode.

12. The method as claimed in claim 11, further comprising, after the forming of the top gate electrode and the top electrode, forming an active layer including a source region and a drain region and a bottom electrode by doping two sides of the active layer pattern and the bottom electrode pattern with ion impurities.

13. The method as claimed in claim 11, further comprising, between the step of forming of the bottom gate electrode and the step of forming the top gate electrode and the top electrode, forming an active layer including a source region and a drain region and a bottom electrode by doping two sides of the active layer pattern and the bottom electrode pattern with ion impurities.

14. The method as claimed in claim 11, further comprising:
forming an interlayer insulating layer that covers the top gate electrode and the top electrode; and
forming a first contact hole, a second contact hole, and a third contact hole that expose a source region, a drain region, and the top electrode, respectively, by etching the interlayer insulating layer,
wherein the forming of first, second, and third contact holes includes a wet etching operation with a buffered oxide etchant.

15. The method as claimed in claim 11, wherein the top gate electrode and the top electrode include at least one of Mo, Ti, a Mo/Ti structure, and a Mo/Al/Ti structure.

16. The method as claimed in claim 11, wherein the top gate electrode and the top electrode each have a thickness ranging from about 50 nm to about 200 nm.

17. The method as claimed in claim 11, wherein the active layer pattern and the bottom electrode pattern are formed of a semiconductor material.

18. The method as claimed in claim 11, wherein the bottom gate electrode is a bi-layer.

* * * * *